United States Patent [19]
Watanabe et al.

[11] Patent Number: 5,578,403
[45] Date of Patent: Nov. 26, 1996

[54] METHOD FOR MANUFACTURE OF A SUBSTRATE HAVING WINDOW-SHAPED AND FRAME-SHAPED COATING FILMS ON THE SURFACE THEREOF

[75] Inventors: Tsutomu Watanabe, Itami; Yasuhiko Teshima, Yachiyo; Miki Matsumura, Tokyo; Susumu Miyazaki, Ibaraki-ken; Yoshikatsu Okada, Chiba, all of Japan

[73] Assignee: Shinto Paint Co., Ltd., Amagasaki, Japan

[21] Appl. No.: 273,755

[22] Filed: Jul. 12, 1994

[30] Foreign Application Priority Data

Jul. 26, 1993 [JP] Japan ................................. 5-183794
Jul. 26, 1993 [JP] Japan ................................. 5-183795
Jul. 27, 1993 [JP] Japan ................................. 5-184754
Jul. 27, 1993 [JP] Japan ................................. 5-184755

[51] Int. Cl.$^6$ ................................................ G03F 9/00
[52] U.S. Cl. ............................ 430/7; 430/324; 430/328; 430/329; 430/330
[58] Field of Search .................... 430/7, 324, 329, 430/328, 330

[56] References Cited

U.S. PATENT DOCUMENTS

| | | |
|---|---|---|
| 4,311,773 | 1/1982 | Kaneko et al. . |
| 4,617,094 | 10/1986 | Kamamori et al. . |
| 4,767,723 | 8/1988 | Hinsberg, III et al. ................... 437/41 |
| 4,812,387 | 3/1989 | Suzuki et al. . |
| 4,873,175 | 10/1989 | Suzuki et al. . |
| 4,902,592 | 2/1990 | Matsumura et al. ........................ 430/7 |
| 5,121,237 | 6/1992 | Ikeda et al. ................................ 359/67 |

*Primary Examiner*—George F. Lesmes
*Assistant Examiner*—Laura Weiner
*Attorney, Agent, or Firm*—Watson Cole Stevens Davis, P.L.L.C.

[57] ABSTRACT

A method for manufacturing a substrate having electrically conductive circuits on its surface, window-shaped films on the electrically conducive circuits and a frame-shaped film at the regions not occupied with the window-shaped films, includes the steps of:

(a) coating the surface of a transparent substrate with a photoresist composition to cover the electrically conductive circuits-carrying surface of the substrate, followed by forming a photoresist film, (b) superposing a photomask on the surface of the photoresist film formed in step (a) and exposing the thus mask-superposed photoresist film to light, (c) subjecting the substrate obtained in step (b) to development, (d) subjecting the photoresist film left in step (c) to heat-treatment, second exposure to light or no treatment, (e) subjecting the substrate passed the steps (a) to electro-deposition using the electrically conductive circuits on the substrate as one electrode to form electro-deposition coating films, (f) eliminating the photoresist film having been subjected to heat-treatment, second exposure to light or no treatment in step (d) and leaving the electro-deposition coating films formed in step (e), (g) coating the whole surface of the transparent substrate passed the steps (a) to (f) in this order with a negative photoresist composition to cover the electrically conductive circuits-carrying surface of the substrate, followed by forming a functional coating film, (h) exposing the surface opposite to the electrically conductive circuits-carrying surface of the transparent substrate passed the steps (a) to light, and (i) eliminating the uncured parts irrespective of step (h) from the functional coating film.

17 Claims, 4 Drawing Sheets

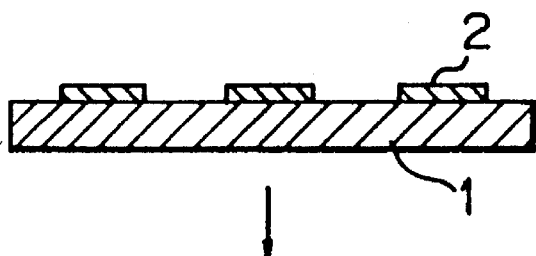
FIG. 1a
FIG. 1b
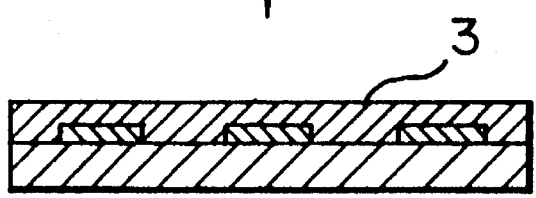
FIG. 1c
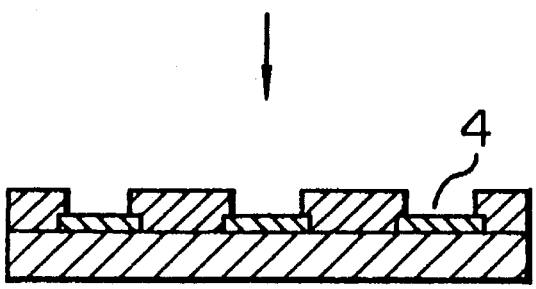
FIG. 1d
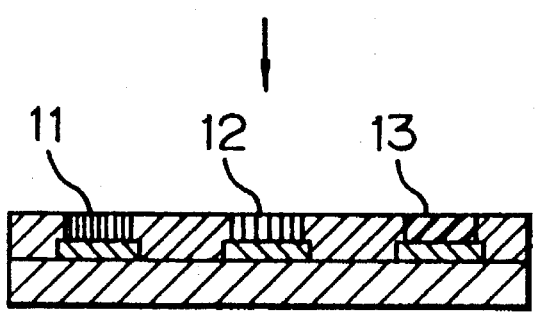
FIG. 1e
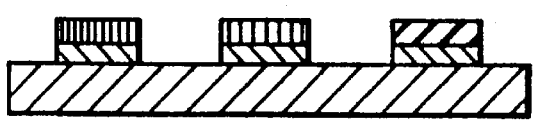
FIG. 1f
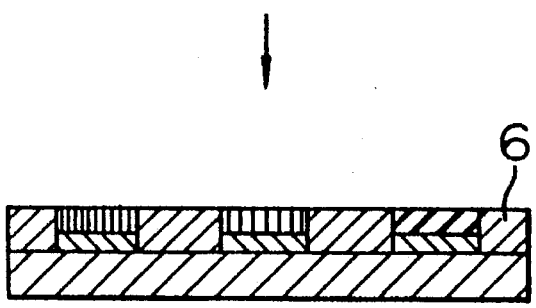

METHOD FOR MANUFACTURE OF A SUBSTRATE HAVING WINDOW-SHAPED AND FRAME-SHAPED COATING FILMS ON THE SURFACE THEREOF

The present invention relates to a method for manufacturing a substrate having on the surface thereof window-shaped coating films and a frame-shaped, functional coating film having light-screening properties at the regions not occupied with the window-shaped coating films. The method of the present invention is particularly useful for producing a color filter used in a color liquid crystal display (LCD), which has window-shaped, colored coating films and a frame-shaped, functional film having a function of screening unnecessary lights or achieving other desirable properties. This method is particularly useful for production of a color filter, which is used in a matrix type color display formed using a thin film transistor (TFT) and a color filter.

Liquid crystal displays have so far been used for goods with a small-sized display such as the so-called pocket-sized television. However, the size of liquid crystal displays has rapidly been enlarged in recent years. The image quality of liquid crystal displays has also been improved by the development from TN liquid crystals to STN liquid crystals and active driving elements exemplified by TFT, which has enabled the commercialization of goods with a liquid crystal display having as high image quality as cathode-ray tubes. Various studies have been conducted for improving the image quality and productivity of the color displays using TFT. Of these studies, the method for forming a light screening film called a black matrix that prevents light leakage toward TFT and improves the image quality (apparent contrast) and the shape of the light screening film are of great concern.

As the method for forming a lattice-form frame-shaped, functional film at the regions not occupied with colored, window-shaped films for the production of a color filter used for colorization of LCD, there are known methods utilizing printing techniques such as silk screen method, offset method, etc.

There is also known a method for forming a functional coating film as a black matrix in the gaps of stripe-form colored coating films, which comprises foaming stripe-form colored coating films on a plurality of parallel stripe-form conductive circuits arranged on a transparent substrate by an electro-deposition method; coating a negative photoresist composition capable of giving a functional coating film on the whole surface of the substrate so as to cover the stripe-form colored coating films, followed by forming the photoresist film; exposing the photoresist film to light from the opposite side of the photoresist-carrying surface of the substrate so that the stripe-form colored coating films function as a mask; and eliminating the uncured photoresist film (JP-A-62-247331).

With respect to TFT type liquid crystal displays which are considered promising in recent years, in order for improving an image quality, it is required to improve a light screening capacity of the light screening film which is, of course, important for preventing light leakage toward a switching element, and to form the light screening film in a lattice pattern.

However, conventional methods for forming a frame-shaped, functional film utilizing printing techniques are disadvantageous in that they cannot provide a functional coating film of high precision. For example, when a lattice-form functional film is formed by the conventional methods, the film formed has a coarse pattern in which the lattice gap is about 100 µm.

On the other hand, the method disclosed in JP-A-62-247331 enables formation of a functional coating film between the stripe-form colored coating films with high precision; however, this method has a problem that a functional coating film is difficult to be formed in the transverse direction of the stripe-form colored coating films to obtain a lattice form.

Thus, it is an object of the present invention to solve the above-mentioned problems of prior art by providing an industrially advantageous method for manufacturing a substrate particularly useful as a color filter for LCD, and having window-shaped coating films and a frame-shaped, functional coating film having light-screening and other desirable properties at the regions not occupied with the window-shaped coating films particularly with high precision and a fine pattern such as a window width of less than 100 µm.

Having taken notice that coating films can be formed only on conductive circuits selectively with high precision by the electro-deposition method, the present inventors have extensively studied, and as a result the present invention has been accomplished.

The present invention provides a method for manufacturing a substrate having electrically conductive circuits on the surface thereof, window-shaped coating films on the circuits and a frame-shaped, functional coating film at the regions not occupied with the window-shaped coating films, which comprises the steps of:

(a) coating a transparent substrate having electrically conductive circuits on the surface thereof with a negative or positive photoresist composition to cover the whole circuits-carrying surface of the substrate, followed by forming a photoresist film, (b) superposing, on the surface of the photoresist film formed through step (a), a photomask having a pattern designed so as to give the photoresist film in a shape prescribed in the following step (c), and exposing the thus masked photoresist film to light, (c) subjecting the resulting substrate formed through steps (a) and (b) to development, eliminating the photoresist film in the window-shaped parts on the electrically conductive circuits or both the photoresist film in the window-shaped parts on the electrically conductive circuits and that in the parts adjacent to one or both of the left and right sides of the window-shaped parts and leaving the photoresist film in the other parts, and (d) subjecting the photoresist film left in step (c) to heat-treatment, second exposure to light or no treatment, (e) subjecting the substrate formed through steps (a) to (d) in this order to electro-deposition using the circuits on the substrate as one electrode, forming electro-deposition coating films at the window-shaped parts on the circuits, the electro-deposition coating films being capable of screening light emitted in the following step (h), (f) eliminating the photoresist film having been subjected to heat-treatment, second exposure to light or no treatment in step (d) and leaving the electro-deposition coating films formed in step (e), (g) coating the substrate formed through steps (a) to (f) in this order with a negative photoresist composition capable of giving a functional coating film to cover the whole circuits-carrying surface of the substrate, followed by forming a functional coating film, (h) exposing the substrate formed through steps (a) to (g) in this order to light emitted from the opposite side of the circuits-carrying surface of the substrate, and (i) eliminating the uncured functional coating film having not been exposed to light in step (h), provided that when the photoresist film left in step (c) has a shape of lattice, the treatment of step (d) is heat treatment or second exposure to light.

BRIEF DESCRIPTION OF THE DRAWINGS

FIGS. 1a–1f is a cross-sectional schematic view illustrating the products formed through respective steps of the method of the present invention.

In FIG. 1a is a transparent substrate having a plurality of electrically conductive circuits; FIG. 1b is an intermediate product obtained through step (a); FIG. 1c is an intermediate product obtained through steps (b), (c) and (d); FIG. 1d is an intermediate product obtained through step (e); FIG. 1e is an intermediate product obtained through step (f); and FIG. 1f is a final product obtained through steps (g), (h) and (i).

In FIG. 2a exemplifies a pattern of the conductive circuits, FIG. 2b a pattern of the frame-shaped photoresist film obtained after elimination of those in the window-shaped parts in step (c), and FIG. 2c a pattern of the window-shaped coating film obtained through step (e).

In FIG. 3a exemplifies a pattern of the conductive circuits, FIG. 3b a pattern of the photoresist film after elimination of those in both the window-shaped parts and the parts adjacent to the left and right sides of the window-shaped parts in step (c), and FIG. 3c a pattern of the coating film obtained through step (e).

FIG. 4A, the conductive circuits are patterned in a parallel stripe-form, and the photomask are patterned so as to eliminate both the photoresist films in the window-shaped parts on the conductive circuits and those in the parts adjacent to the left and right sides of the window-shaped parts, and in FIG. 4B, the conductive circuits in a modified parallel stripe-form, and the photomask so as to eliminate the photoresist film in the window-shaped parts.

In FIGS. 1 to 4, 1 is a transparent substrate, 2 is an electrically conductive circuit, 3 is a photoresist coating film, 4 is a window-shaped vacant hole, 5 is a window-shaped coating film, 6 is a frame-shaped coating film, 7 is a photomask, 8 is a transparent part of the photomask, 9 is a light-screening part of the photomask, 11 is a coating film (red) formed in the window-shaped vacant hole, 12 is a coating film (green) formed in the window-shaped vacant hole, and 13 is a coating film (blue) formed in the window-shaped vacant hole.

Figure 2A:
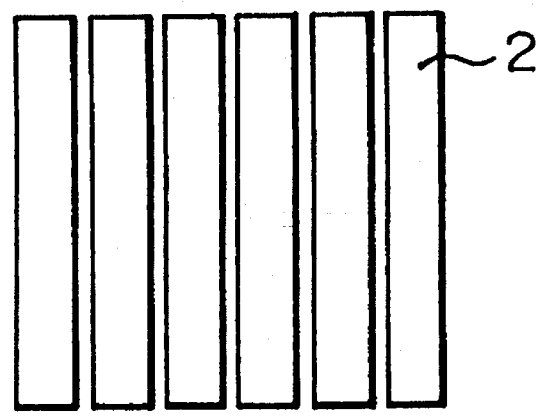
FIGS. 2a–2c is a schematic plan view exemplifying respective patterns of the conductive circuits, the frame-shaped coating film and the window-shaped coating films.

The transparent substrate which can be used in the present invention includes glass boards, plastic boards and the like. The electrically conductive circuits formed on the substrate are prepared from a transparent conductive material such as ITO film (tin-doped indium oxide film), NESA film (antimony-doped tin oxide film) and the like. The pattern of the electrically conductive circuits is usually a parallel arrangement of stripes. As referred to herein, the term "stripe" involves not only a longitudinally extended straight line as-shown in FIG. 4A but also a line picturing a convexity or concavity from the left side to the right side as shown in FIG. 4B. These stripes can be produced in a conventional manner.

Step (a) of the present invention is a step of coating the transparent substrate having electrically conductive circuits on the surface thereof with a negative or positive photoresist composition to cover the whole circuits-carrying surface of the substrate, followed by forming a negative or positive photoresist film.

Examples of the positive photoresist composition usable in step (a) include a composition containing a novolac type phenolic resin and an esterified product of o-quinonediazide, and the like. Commercially available positive photoresist compositions are OFPR-800 (trade name, manufactured by Tokyo Ohka Co., Ltd.), PF-7400 (trade name, manufactured by Sumitomo Chemical Co., Ltd.), FH-2030 (trade name, manufactured by Fuji Hant Electronics Technology Co., Ltd.), etc.

Examples of the negative photoresist composition usable in step (a) includes a composition containing an acrylate resin and a photo-polymerization initiator such as benzophenone compounds, anthraquinone compounds and the like, etc. Commercially available negative photoresist compositions are OMR-83 (trade name, manufactured by Tokyo Ohka Co., Ltd.).

As the method for coating the negative or positive photoresist composition on the surface of the substrate having conductive circuits, screen printing method, offset printing method, roll coating method, bar coating method, spin coating method, etc. can be adopted. Among these, the spin coating method is recommendable because of high fidelity and high precision.

When spin coating method is selected of these methods, it is preferable to add a solvent (e.g. non-reactive solvent such as ethyl cellosolve acetate etc.) to the positive or negative photoresist composition for the sake of lowering the viscosity. It is particularly preferable to adjust the total amount of the solvent to 5 to 40 parts by weight per 100 parts by weight of the photoresist composition.

In carrying out the spin coating, it is preferred to change the whirler in two stages in a manner such that the photoresist composition is spread on a substrate at 100–400 rpm in the first stage, and thickness of the photoresist composition is made even at 800–5,000 rpm in the second stage.

The negative or positive photoresist composition coated on the substrate having conductive circuits is preferably heat-treated at 60°–100° C. for 5–60 minutes, thereby forming the photoresist film. By this heat-treatment, the resin in the negative or positive photoresist composition is preliminarily cured, and the adhesion of the photoresist film to the substrate having conductive circuits is improved.

Step (b) of the present invention is a step of superposing, on the surface of the photoresist film formed through step (a), a photomask having a pattern designed so as to give the photoresist film in a desired shape prescribed in the following step (c), and exposing the thus masked photoresist film to light.

Figure 4A:
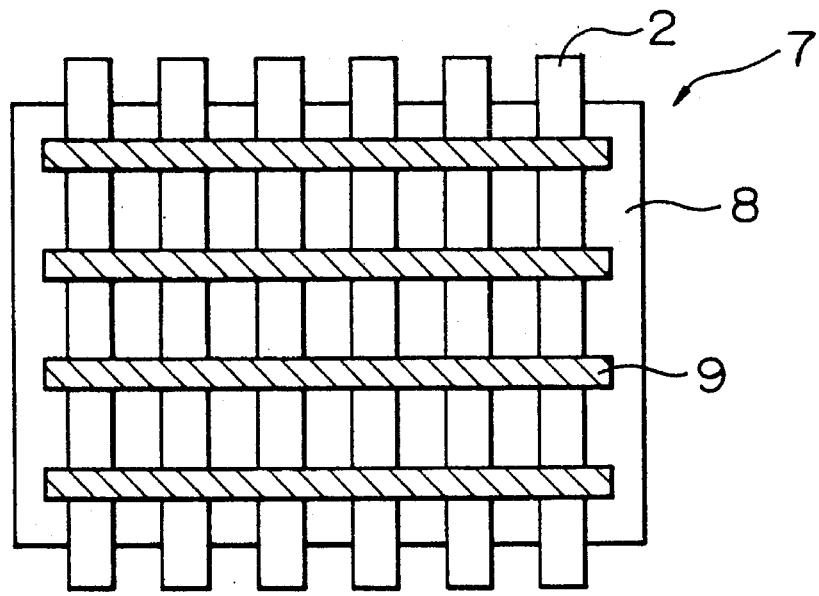
FIG. 4A–B a schematic plan view exemplifying respective patterns of the conductive circuits and the photomask usable in the present invention.
Figure 4B:
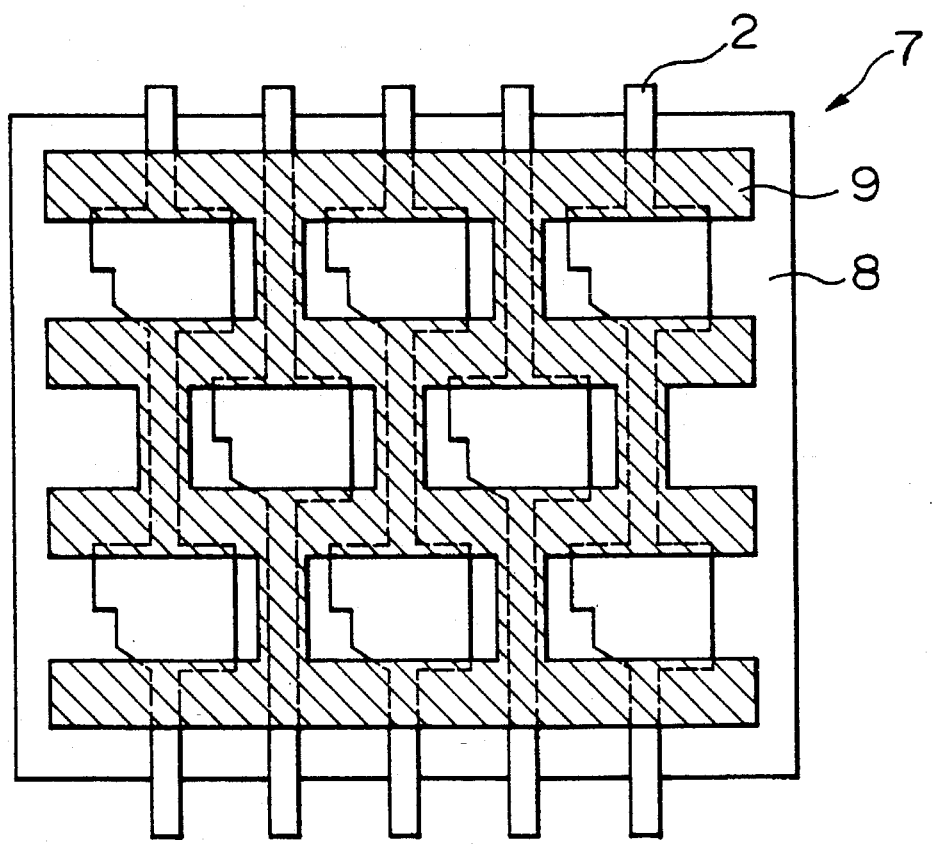

Schematic plan views of some examples of the photomask and the ground electrically conductive circuits are shown in FIGS. 4A and 4B. The photomask patterns shown in FIGS. 4A and 4B are examples which can give a coating film not covering the window-shaped parts and the parts adjacent to left and right sides thereof but covering the other parts in the following step (c).

The photomask used in step (b) has any of the following patterns:

(i) a pattern capable of giving a photoresist film not covering the window-shaped parts on the electrically conductive circuits, but covering the frame-shaped parts after the development of step (c); and (ii) a pattern capable of giving a photoresist film not covering the window-shaped parts and the parts adjacent to one or both of the left and right sides of the window-shaped parts but covering the other parts after the development of step (c).

When the film is a positive photoresist film, the photoresist film under the light-screening part of the mask is cured by exposure and remains after development as a part insoluble in developing solution, while the photoresist film located under the transparent parts of the mask is decomposed and eliminated after development. When the film is a negative photoresist film, a reverse phenomenon takes place.

In the exposure of step (b), lights of various wavelength ranges can be used depending on the kind of the positive or negative photoresist film. Generally speaking, lights of UV region are desirable. As the light source, apparatuses using super-high pressure mercury lamp, metal halide lamp and the like can be used. From the viewpoint of accuracy of patterning, those apparatuses which have a mirror type of parallel light structure are preferred.

The conditions of exposure vary depending on the light source and the kind of photoresist film. In the case of positive photoresist film, the light exposure is usually in the range of 10–500 mJ/cm². In the regions exposed to light, a decomposition reaction progresses, whereby the resist becomes soluble in the developing solutions mentioned later. In the case of negative photoresist film, the light exposure is usually in the range of 10–500 mJ/cm². In the regions not exposed to light, no curing reaction progresses, so that such regions remain soluble in the developing solutions mentioned later.

Step (c) of the present invention is a step of subjecting the resulting substrate formed through steps (a) and (b) to development, eliminating the photoresist film in the window-shaped parts on the electrically conductive circuits or both the photoresist film in the window-shaped parts on the electrically conductive circuits and that in the parts adjacent to one or both of the left and right sides of the window-shaped parts and leaving the photoresist film in the other parts.

The agent used for the development is appropriately selected depending on the kind of the negative or positive photoresist film. Examples thereof are aqueous alkaline solutions of caustic soda, sodium carbonate, quaternary ammonium salts, organic amines or the like, and organic solvents such as esters, ketones, alcohols, aromatic hydrocarbons, chlorinated hydrocarbons and the like. The elimination can be effected by dipping or showering the substrate in or with the developing agent for a period ranging from 5 seconds to about 3 minutes. Subsequently, the resulting substrate is thoroughly rinsed with city water, deionized water or the like.

Step (d) of the present invention is a step of subjecting the photoresist film left in step (c) to heat-treatment, second exposure to light or no treatment.

The heat treatment can be carried out for the purpose of suppressing the reaction between the positive or negative photoresist film formed in step (c) and the electro-deposition coating films formed in the following step (e), which reaction would take place in the course of optional heat-treatment of the electro-deposition coating films in step (e), and for the purpose of facilitating the elimination of the positive or negative photoresist film in step (f). By this heat treatment can be prevented defects such that the positive or negative photoresist film remains in the neighborhood of electro-deposition coating films even after the elimination procedure in step (f), the electro-deposition coating films are easy to peel, and the desired functional coating film is damaged. The heat treatment is preferably carried out at 150°–240° C. for 0.5–2 hours, and more preferably at 200°–220° C. for about one hour.

Second exposure to light can be carried out for the purpose of facilitating the elimination of the photoresist film after forming an electro-deposition coating film on the window-shaped parts in the subsequent step, particularly when the photoresist composition used in step (a) is positive. By the second exposure to light, the positive photoresist film is photo-degraded and becomes readily soluble in the developing agent such as aqueous alkaline solutions and the like. The light exposure in this second exposure treatment preferably falls within the range of 100–400 mJ/cm², although it may vary depending upon the kind of positive photoresist.

When the photoresist coating film which has been left uneliminated in step (c) has a lattice-form, the treatment of step (d) is heat-treatment or second exposure to light.

When the photomask used in step (b) has the pattern (i) mentioned above, the treatment of this step (d) is preferably heat treatment. When the photomask used in step (b) has the pattern (ii) mentioned above, the treatment of this step (d) is preferably heat treatment or no treatment.

When the photoresist composition used in step (a) is a positive photoresist composition, the treatment of this step (d) is preferably second exposure to light.

Step (e) of the present invention is a step of subjecting the substrate formed through steps (a) to (d) in this order to electro-deposition using the circuits on the substrate as one electrode, forming electro-deposition coating films at the window-shaped parts on the circuits, the electro-deposition coating films being capable of screening light emitted in the following step (h).

The methods of electro-deposition on this sort of conductive circuits are generally well known. For example, the method mentioned in Jitsumu Hyomen Gijutsu (Metal Finishing Practice), Vol. 34, No. 6 (1987), p. 57–63 and JP-B-4-64875 can be referred to. This method includes anionic and cationic coating methods, and any of these methods may be adopted in the present invention. However, anionic coating method is preferably to the cationic method because of smaller influence on the circuits. A resin material (binder) used in the electro-deposition includes, for example, maleinated oil type, acrylic type, polyester type, polybutadiene type and polyolefin type resin materials. These resin materials may be used either singly or in the form of mixture. Into the binder, a pigment having a nature of screening the light used in step (h) described below and other coloring pigments are incorporated. An electro-depositing solution is usually prepared by dispersing a binder and other ingredients in water and diluting the resulting dispersion. As the electro-depositing solution, not only aqueous electro-depositing solutions but also non-aqueous electro-depositing solutions using an organic solvents are usable.

A transparent substrate formed through the above-mentioned steps (a) to (d) in this order is introduced into a bath containing the electro-depositing solution. In the case of anionic electro-deposition, the conductive circuits on the substrate are used as positive electrode, and a corrosion-resistant, electrically conductive material (e.g. stainless steel or the like) is used as a counter electrode, and then a direct current voltage is applied. Thus, electro-deposition coating films are selectively formed in the window-shaped parts on the conductive circuits. No electro-deposition coating film is formed in the parts where the photoresist film exists and in the parts where the conductive circuits do not exist.

The thickness of the electro-deposition coating films can be controlled by changing the conditions of electro-deposition. Usually, the period of the electro-deposition is from about 1 second to about 3 minutes at a voltage of 10–300 V. After formation of electro-deposition coating films, the coating films are thoroughly washed to remove unnecessary substances therefrom. If desired, the coating films are heat-treated at 90°–280° C. for 10–120 minutes in order to enhance its strength. The lower limit of the temperature is preferably 100° C., the upper limit of the temperature is preferably 150° C., and the longer limit of the period is preferably 60 minutes.

Step (f) of the present invention is a step of eliminating the photoresist film having been subjected to heat-treatment, second exposure to light or no treatment in step (d) and leaving the electro-deposition coating films formed in step (e).

A method for eliminating the photoresist film is known in the field of printed circuit forming technique [for example, Circuit Technology, Vol. 4, No. 4 (1989), p. 197; "Printed Circuit Boards", Sentangijutsu Shuusei, published by Keiei System Kenkyusho (Feb. 10, 1987), p. 308]. The elimination of the photoresist film can be carried out by contacting the photoresist film with an appropriate dissolving agent. The dissolving agent is selected in accordance with the kinds of the photoresist film to be eliminated and electro-deposition coating film. Examples thereof are an aqueous alkaline solution of caustic soda, sodium carbonate, quaternary ammonium salts, organic amines or the like and an organic solvent such as esters, ketones, alcohols, ethers, chlorinated hydrocarbons and the like. The elimination of the photoresist film can be effected by the method of dipping or showering for a period of 30 seconds to about 20 minutes. A rubbing means such as brush, woven fabric and the like may be used. Thereafter, the thus treated substrate may be rinsed thoroughly with organic solvent, water or the like. If desired, the electro-deposition coating film is baked by a heat treatment at 100°–280° C. for 5–120 minutes. The shorter limit of the time period is preferably 10 minutes, and the longer limit of the time period is preferably 60 minutes.

By this step, there is obtained an intermediate product having electro-deposition coating films at the window-shaped parts and no coating film at the other parts.

Step (g) of the present invention is a step of coating the substrate formed through the steps (a) to (f) in this order with a negative photoresist composition capable of giving a functional coating film to cover the whole conductive circuits-carrying surface of the substrate, followed by forming a functional coating film. The coating film formed in this step has a function such as a black matrix of color filter for use in LCD.

The coating can be carried out by a method capable of giving a uniform coating film, such as spin coating method, roll coating method, screen printing method, offset printing method, dip coating method and the like. Preferred negative photoresist compositions include the so-called UV-curable photoresist composition. The main ingredient thereof includes, for example, acryl, urethane or epoxy resin, synthetic rubber, polyvinyl alcohols, gums or gelatin. These ingredients may be used either singly or in the form of mixture. The compositions thus prepared are commercially available as photo-curable paints, inks and negative resists. Into these compositions, a reactive diluent, a reaction initiator, a photo sensitizer and the like may optionally be incorporated.

Further, in accordance with functions to be demanded, additives may be added thereto. For example, when the product is used for the purpose of screening light, an appropriate pigment or light-screening agent may be added. When a function of adhesion is required, an appropriate adhesion-improving material may be added. In coating the negative photoresist composition, the composition may be diluted to an appropriate viscosity or an appropriate solid content in order to improve the workability, by the use of an appropriate organic solvent in the case of organic solvent-dilution type compositions or by the use of water in the case of water-dilution type compositions.

Subsequently, the substrate coated with the negative photoresist composition is preferably heat-treated at 60°–120° C. for 1–30 minutes to form the functional coating film.

Step (h) of the present invention is a step of exposing the substrate formed through steps (a) to (g) in this order to light emitted from the opposite side of the conductive circuit-carrying surface of the substrate.

For the exposure, lights of various wavelength ranges may be used depending on the kind of the negative photoresist. Generally speaking, lights of the UV region are preferred. As the light source, apparatuses using super-high pressure mercury lamp, metal halide lamp or the like can be used. Although the conditions of exposure vary depending on the light source and the kind of negative photoresist, the light exposure is usually within the range of 100–2,000 mJ/cm$^2$ and the time period of exposure is usually within the range of 0.1–60 seconds. In the area exposed to light, a crosslinking reaction progresses whereby the functional coating film becomes insoluble and cures.

Step (i) of the present invention is a step of eliminating from the functional coating film the uncured parts which have not been exposed to light in step (h).

The elimination is carried out by contacting the functional coating film with an appropriate dissolving agent, such as a developing solution, and thereby dissolving out the uncured parts of the functional coating film. The agent is appropriately selected in accordance with the kind of negative photoresist film. Examples thereof are aqueous alkaline solutions of caustic soda, sodium carbonate, quaternary ammonium salts, organic amines or the like and organic solvents such as esters, ketones, alcohols, chlorinated hydrocarbons and the like. The dissolution of the uncured photoresist film may be carried out by the method of dipping or showering the substrate in or with the agent for a time period of 30 seconds to about 5 minutes. Thereafter, the thus treated substrate is thoroughly washed with water, organic solvents or the like. Subsequently, the washed substrate may optionally be heat-treated at 10°–280° C. and preferably at 100°–280° C., for a period of 10–120 minutes and preferably for 10–12 minutes.

By this step, a frame-shaped, functional coating film is formed.

In producing a color filter for use in LCD or the like, the window-shaped, colored electro-deposition coating film and a frame-shaped, functional film having a function of black matrix are formed on a transparent substrate having electrically conductive circuits on its surface by the method of the present invention, and subsequently an overcoat film (protecting film) is formed thereon as occasion demands. The material for the overcoat film includes, for example, epoxy type, polyimide type and acrylate type resins. The overcoat film is formed by applying such a resin by means of spin coater, roll coater or the like, and thereafter thermally baking the resin. On the overcoat film is formed a transparent conductive film for driving the liquid crystal, and further thereon, a circuit pattern is optionally formed, whereby a desired color filter can be produced.

The present invention is explained in more detail with reference to the following examples which are only illustrative.

EXAMPLE 1

(1) Formation of Stripe-form, Transparent, Electrically Conductive Circuits on Transparent Substrate Stripe-form ITO circuits (sheet resistance: 15 Ω/□) each having a width of 80 μm were formed in parallel and linearly on a glass substrate having a thickness of 1.1 mm, at intervals of 20 μm (100 μm pitch).

(2) Formation of Positive Photoresist Film

A positive photoresist film having a film thickness of 1.5 μm was formed by adding 20 parts by weight of ethyl cellosolve acetate to 100 parts by weight of a positive photoresist composition (trade name: FH2030, manufactured by Fuji Hant Electronics Technology Co.) to obtain a mixture, coating the whole surface of the transparent substrate obtained in (1) with the mixture obtained above by spin coating method in two stages, namely firstly at 200 rpm/5 seconds and secondly at 1,000 rpm/20 seconds, and heat-treating the resulting coat at 90° C. for 30 minutes. This procedure illustrates step (a) of the present invention.

(3) Exposure to Light

On the positive photoresist film, a lattice-wise patterned photomask having light-screening window-shaped parts of one window size of 60 μm×200 μm was aligned with the ground transparent conductive circuit pattern (lines/spaces: 80 μm/20 μm) so as to locate the window-parts on the circuit line. The gap between the photomask and the photoresist film was 30 μm. Then, the resulting product was exposed to light at a light exposure of 100 mJ/cm$^2$ with Proximity Exposing Machine (MAP-1200, manufactured by Dainippon Kaken Co.) using super-high pressure mercury lamp as light source.

(4) Development

After the exposure, the product of (3) was immersed in a developing solution (trade name: SOPD, manufactured by Sumitomo Chemical Co., Ltd.) for 60 seconds at 25° C. to eliminate and develop the exposed parts, and then rinsed with water and air-dried. Thus, a lattice-form, frame-shaped positive photoresist film having window-shaped pits on the ground, parallel stripe-form transparent conductive circuits was formed. This procedure illustrates step (c) of the present invention.

(5) Heat-treatment

The substrate obtained in (4) having a lattice-form, frame-shaped positive photoresist film was heat-treated in an oven at 220° C. for one hour. This procedure illustrates step (d) of the present invention.

(6) Formation of Electro-deposited Film

Using prescribed transparent conductive circuits on the transparent substrate as one electrode, electro-deposition was carried out in order of red, green and blue coatings. As the electro-deposition coating materials, aqueous solutions of an anionic polyester resin containing a red pigment (azo metallic salt type red pigment), a green pigment (Phthalocyanine Green) and a blue pigment (Phthalocyanine Blue), respectively, in the state of dispersion [trade name Shintron F-Red-C (red), trade name Shintron F-Green-C (green) and trade name Shintron F-Blue-C (blue), all manufactured by Shinto-Chemitron Co.] were used. The electro-deposition was carried out at 50–80 V for a period of 10–20 seconds, which conditions were varied depending on the color. Then, the resulting electro-deposited films were thoroughly washed with water and heat-treated at 260° C. for one hour.

As a result, red-, green- and blue-colored films each having a thickness of 1.2 μm were formed in the prescribed order in the window-shaped pits carrying no positive photoresist film. These films had properties of screening UV light used in (9) described below. This procedure illustrates step (e) of the present invention.

(7) Elimination of Positive Photoresist Film

The transparent substrate obtained by the above-mentioned steps was immersed in 5% by weight caustic soda solution heated to 40° C. for 15 minutes, and then the positive photoresist film on the substrate was brushed while showering deionized water to eliminate and peel off the positive photoresist film only. Then, the resulting product was thoroughly washed, air-dried and heat-treated at 200° C. for 30 minutes. This procedure illustrates step (f) of the present invention.

(8) Formation of Negative Photoresist Film

A coating material for black mask (negative photoresist, manufactured by Shinto-Chemitron Co.) was coated by the screen printing method on the whole surface of the substrate obtained in (7). After the coating, the coating film was heat-treated at 100° C. for 10 minutes. The film thus formed had a thickness of about 8 μm. This procedure illustrates step (g) of the present invention.

(9) Exposure of Negative Photoresist Film to Light

The substrate obtained in (8) was exposed to UV light from the opposite side of the conductive circuits-carrying surface at a distance of 10 cm for a period of 10 seconds. The light exposure was 1,800 mJ/cm$^2$. The main wavelengths of the UV light used herein were 313 nm and 365 nm. The procedure illustrates step (h) of the present invention.

(10) Development and Washing

The substrate obtained in (9) was then immersed in ethyl cellosolve acetate for 2 minutes, while applying ultrasonic wave thereto, whereby the coating film of the unexposed parts [the parts obstructed from exposure due to the existence of light-screening film formed in (6)] was eliminated. Then, the resulting product was immersed in an ethyl cellosolve acetate washing liquor for 30 seconds, and thereafter immersed in isopropyl alcohol and deionized water successively each for a period of 30 seconds. Then, the resulting product was heated and the remaining films were cured at 230° C. for 30 minutes.

As a result, a lattice-form, frame-shaped functional film (black mask, film thickness: 1.2 μm) was formed. This procedure illustrates step (i) of the present invention.

Figure 2B:
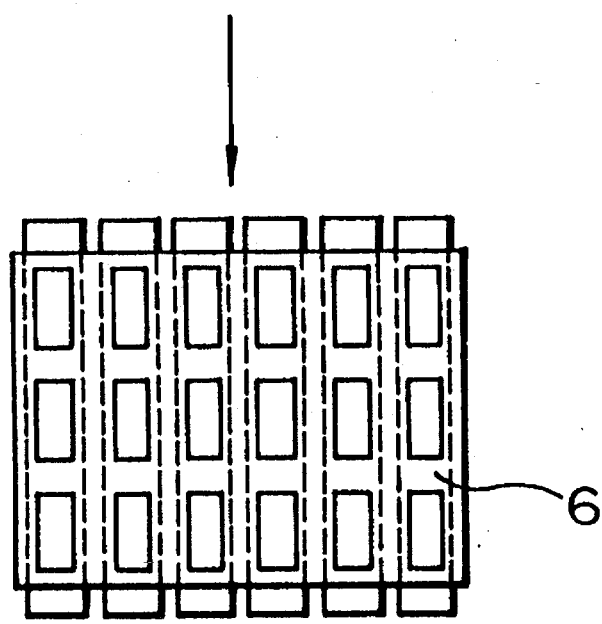
Figure 2C:
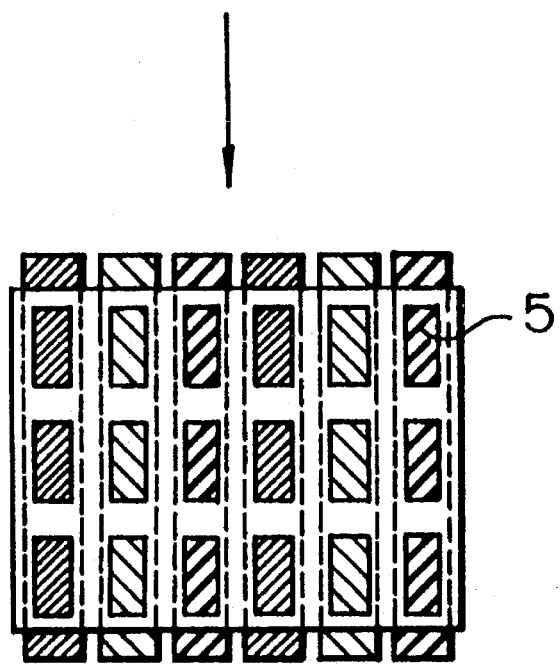

FIGS. 2a–2c shows the pattern of the thus obtained window-shaped, color films and the lattice-form, frame-shaped functional film.

Observation of the product obtained herein by means of an optical microscope (trade name OPTIPHOT-88, manufactured by NIKON CORP.) at a magnification of 200 revealed that no leakage of light was noticeable between the window-shaped color films and the lattice-form, frame-shaped functional coating film, and the films were all formed with a high precision.

EXAMPLE 2

(1) Formation of Stripe-form, Transparent, Electrically conductive circuit pattern on transparent substrate On a glass substrate having a thickness of 1.1 mm, stripe-form ITO circuits (sheet resistance: 15 Ω/□) each having a width of 80 μm were formed in parallel and linearly at intervals of 20 μm (100 μm pitch).

(2) Formation of Positive Photoresist Film

A positive photoresist film having a film thickness of 1.5 μm was formed by adding 20 parts by weight of ethyl cellosolve acetate to 100 parts by weight of a positive photoresist composition (trade name: FH2030, manufactured by Fuji Hant Electronics Technology Co.) to obtain a mixture, coating the whole surface of the transparent substrate obtained in (1) with the mixture obtained above by spin coating method in two stages, namely first at 200 rpm/5 seconds and secondly at 1,000 rpm/20 seconds, and heat-treating the resulting coat at 90° C. for 30 minutes. This procedure illustrates step (a) of the present invention.

(3) Exposure to Light

On the positive photoresist film, a photomask with a pattern of alternately pictured light-screening lines and transparent spaces (lines/spaces: 100 μm/200 μm) was aligned with the ground parallel, stripe-form, transparent, electrically conductive circuits (lines/spaces: 80 μm/20 μm) so that the lines and spaces of the photomask were placed perpendicularly to the longitudinal direction of the conductive circuits. The gap between the photomask and the photoresist film was 30 μm. Then, the resulting product was exposed to light at a light exposure of 100 mJ/cm² with Proximity Exposing Machine (MAP-1200, manufactured by Dainippon Kaken Co.) using super-high pressure mercury lamp as light source. This procedure illustrates step (b) of the present invention.

(4) Development

After the exposure, the product of (3) was immersed in a developing solution (trade name: SOPD, manufactured by Sumitomo Chemical Co., Ltd.) for 60 seconds at 25° C. to eliminate and develop the exposed parts, and then rinsed with water and air-dried. Thus, linear positive photoresist films were formed on the ground, parallel stripe-form, transparent conductive circuits so that the films lay perpendicularly to the longitudinal direction of the conductive circuits. This procedure illustrates step (c) of the present invention.

(5) Heat-treatment

The substrate obtained in (4) having linear positive photoresist films was heat-treated in an oven at 220° C. for one hour. This procedure illustrates step (d) of the present invention.

(6) Formation of Electro-deposited Film

Using prescribed transparent conductive circuits on the transparent substrate as one electrode, electro-deposition was carried out in order of red, green and blue coatings. As the electro-deposition coating materials, aqueous solutions of an anionic polyester resin containing a red pigment (azo metallic salt type red pigment), a green pigment (Phthalocyanine Green) and a blue pigment (Phthalocyanine Blue), respectively, in the state of dispersion [tradename Shintron F-Red-C (red), tradename Shintron F-Green-C (green) and tradename Shintron F-Blue-C (blue), all manufactured by Shinto-Chemitron Co.] were used. The electro-deposition was carried out at 50–80 V for a period of 10–20 seconds, which conditions were varied depending on the color. Then, the resulting electro-deposited films were thoroughly washed with water and heat-treated at 260° C. for one hour.

As a result, red-, green- and blue-colored films each having a thickness of 1.2 μm were formed in the prescribed order in the window-shaped pits carrying no positive photoresist film. These films had properties of screening UV light used in (9) described below. This procedure illustrates step (e) of the present invention.

(7) Elimination of Positive Photoresist Film

The transparent substrate obtained by the above-mentioned steps was immersed in 5% by weight caustic soda solution heated to 40° C. for 15 minutes, and then the positive photoresist films on the substrate was brushed while showering deionized water to eliminate and peel off the positive photoresist films only. Then, the resulting product was thoroughly washed, air-dried and heat-treated at 200° C. for 30 minutes. This procedure illustrates step (f) of the present invention.

(8) Formation of Negative Photoresist Film

A coating material for black mask (negative photoresist, manufactured by Shinto-Chemitron Co.) was coated by the screen printing method on the whole surface of the substrate obtained in (7). After the coating, the coating film was heat-treated at 100° C. for 10 minutes. The film thus formed had a thickness of about 8 μm. This procedure illustrates step (g) of the present invention.

(9) Exposure of Negative Photoresist Film to Light

The substrate obtained in (8) was exposed to UV light of 80 W from the opposite side of the conductive circuits-carrying surface at a distance of 10 cm for a period of 10 seconds. The light exposure was 1,800 mJ/cm². The main wavelengths of the UV light used herein were 313 nm and 365 nm. This procedure illustrates step (h) of the present invention.

(10) Development and Washing

The substrate obtained in (9) was then immersed in ethyl cellosolve acetate for 2 minutes, while applying ultrasonic wave thereto, whereby the coating film of the unexposed parts [the parts obstructed from exposure due to the existence of light-screening film formed in (6)] was eliminated. Then, the resulting product was immersed in an ethyl cellosolve acetate washing liquor for 30 seconds, and thereafter immersed in isopropyl alcohol and deionized water successively each for a period of 30 seconds. Then, the resulting product was heated and the remaining films were cured at 230° C. for 30 minutes.

As a result, a lattice-form, frame-shaped functional film (black mask, film thickness: 1.2 μm) filling the regions not occupied with the window-shaped, color films formed in (6) was formed. This procedure illustrates step (i) of the present invention.

Figure 3A:
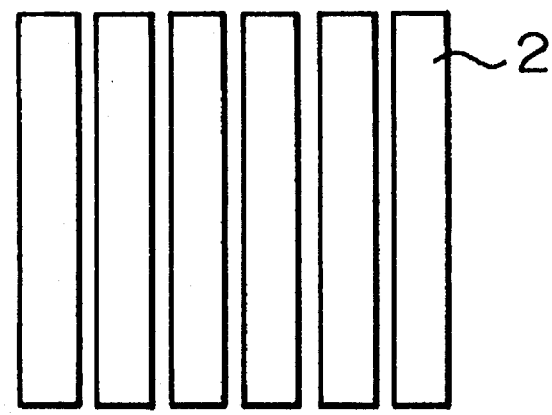
FIGS. 3a–3c is another schematic plan view exemplifying respective patterns of the conductive circuits and intermediate products.
Figure 3B:
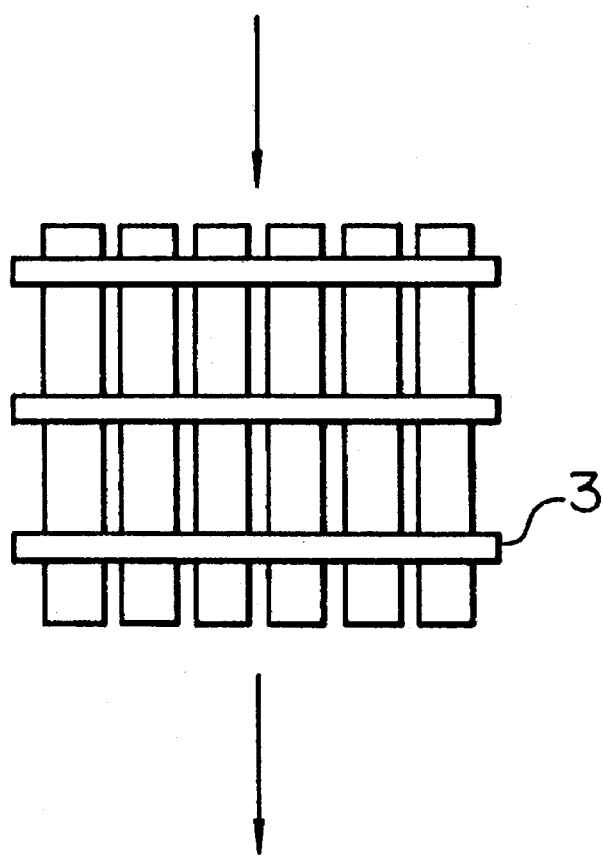
Figure 3C:
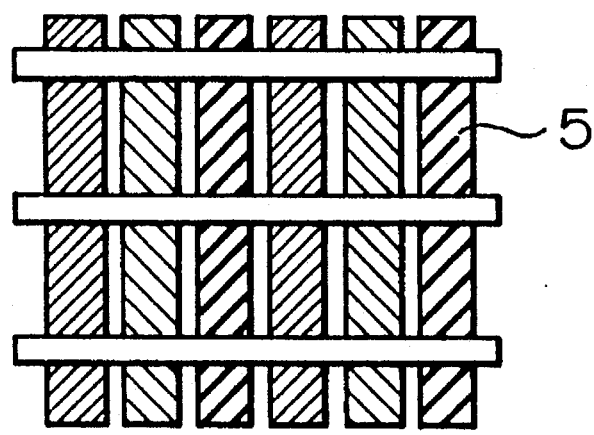

FIGS. 3a—3c shows the pattern of the thus obtained window-shaped, color films and the lattice-form, frame-shaped functional film.

Observation of the product obtained herein by means of an optical microscope revealed that no leakage of light was noticeable between the window-shaped color films and the lattice-form, frame-shaped functional film, and the films were all formed with high precision.

EXAMPLE 3

(1) Formation of Stripe-form, Transparent, Electrically Conductive Circuits Pattern on Transparent Substrate Stripe-form ITO circuits (sheet resistance: 15 Ω/□) each having a width of 80 μm were formed in parallel and linearly on a glass substrate having a thickness of 1.1 mm, at intervals of 20 μm (100 μm pitch).

(2) Formation of Positive Photoresist Film

A positive photoresist film having a film thickness of 1.5 μm was formed by adding 20 parts by weight of ethyl cellosolve acetate to 100 parts by weight of a positive photoresist composition (tradename: FH2030, manufactured by Fuji Hant Electronics Technology Co.) to obtain a mixture, coating the whole surface of the transparent substrate obtained in (1) with the mixture obtained above by spin coating method in two stages, namely firstly at 200 rpm/5 seconds and secondly at 1,000 rpm/20 seconds, and heat-treating the resulting coat at 90° C. for 30 minutes. This procedure illustrates step (a) of the present invention.

(3) Exposure to Light

On the positive photoresist film, a photomask with a pattern of alternately pictured light-screening lines and transparent spaces (lines/spaces: 100 μm/200 μm) was aligned with the ground parallel, stripe-form, transparent, electrically conductive circuits (lines/spaces: 80 μm/20 μm) so that the lines and spaces of the photomask were placed perpendicularly to the longitudinal direction of the conductive circuits. The gap between the photomask and the photoresist film was 30 μm. Then, the resulting product was exposed to light at a light exposure of 100 mJ/cm$^2$ with Proximity Exposing Machine (MAP-1200, manufactured by Dainippon Kaken Co.) using super-high pressure mercury lamp as light source. This procedure illustrates step (b) of the present invention.

(4) Development

After the exposure, the product of (3) was immersed in a developing solution (tradename: SOPD, manufactured by Sumitomo Chemical Co. Ltd.) for 60 seconds at 25° C. to eliminate and develop the exposed parts, and then rinsed with water and air-dried. Thus, linear positive photoresist films were formed on the ground, parallel stripe-form, transparent conductive circuits so that the films lay perpendicularly to the longitudinal direction of the conductive circuits. This procedure illustrates step (c) of the present invention.

(5) Formation of Electro-deposited Film

Using prescribed transparent conductive circuits on the transparent substrate as one electrode, electro-deposition was carried out in order of red, green and blue coatings. As the electro-deposition coating materials, aqueous solutions of an anionic polyester resin containing a red pigment (azo metallic salt type red pigment), a green pigment (Phthalocyanine Green) and a blue pigment (Phthalocyanine Blue), respectively, in the state of dispersion [tradename Shintron F-Red-C (red), tradename Shintron F-Green-C (green) and tradename Shintron F-Blue-C (blue), all manufactured by Shinto-Chemitron Co.] were used. The electro-deposition was carried out at 50–80 V for a period of 10–20 seconds, which conditions were varied depending on the color. Then, the resulting electro-deposited films were thoroughly washed with water and heat-treated at 120° C. for one hour.

As a result, red-, green- and blue-colored films each having a thickness of 1.2 μm were formed in the prescribed order in the window-shaped pits carrying no positive photoresist film. These films had properties of screening UV light used in (8) described below. This procedure illustrates step (e) of the present invention.

(6) Elimination of Positive Photoresist Film

The transparent substrate obtained by the above-mentioned steps was immersed in a stripping solution (tradename: Stripper #10, manufactured by Tokyo Ohka Kogyo Co.) for 5 minutes to eliminate and peel off the positive photoresist films only. Thereafter, the resulting product was thoroughly washed, air-dried and heat-treated at 270° C. for 60 minutes.

By this treatment, the linear positive photoresist films formed in (4) on the ground, parallel stripe-form, transparent conductive circuits and laying perpendicularly to the longitudinal direction of the conductive circuits were eliminated. This procedure illustrates step (f) of the present invention.

(7) Formation of Negative Photoresist Film

A coating material for black mask (negative photoresist, manufactured by Shinto-Chemitron Co.) was coated by the screen printing method on the whole surface of the substrate obtained in (6). After the coating, the coating film was heat-treated at 100° C. for 10 minutes. The film thus formed had a thickness of about 8 μm. This procedure illustrates step (g) of the present invention.

(8) Exposure of Negative Photoresist Film to Light

The substrate obtained in (7) was exposed to UV light of 80 W from the opposite side of the conductive circuits-carrying surface at a distance of 10 cm for a period of 10 seconds. The light exposure was 1,800 mJ/cm$^2$. The main wavelengths of the UV light used herein were 313 nm and 365 nm. This procedure illustrates step (h) of the present invention.

(9) Development and Washing

The substrate obtained in (8) was then immersed in ethyl cellosolve acetate for 2 minutes, while applying ultrasonic wave thereto, whereby the coating film of the unexposed parts [the parts obstructed from exposure due to the existence of light-screening film formed in (5)] was eliminated. Then, the resulting product was immersed in an ethyl cellosolve acetate washing liquor for 30 seconds, and thereafter immersed in isopropyl alcohol and deionized water successively each for a period of 30 seconds. Then, the resulting product was heated and the remaining films were cured at 230° C. for 30 minutes.

As a result, a lattice-form, frame-shaped functional film (black mask, film thickness: 1.2 μm) filling the regions not occupied with the window-shaped, color films formed in (5) was formed. This procedure illustrates step (i) of the present invention.

FIGS. 3a–3c shows the pattern of the thus obtained window-shaped, color films and the lattice-form, frame-shaped functional film.

Observation of the product obtained herein by means of an optical microscope revealed that no leakage of light was noticeable between the window-shaped color films and the lattice-form, frame-shaped functional film, and the films were all formed with high precision.

EXAMPLE 4

(1) Formation of Stripe-form, Transparent, Electrically Conductive Circuits Pattern on Transparent Substrate Stripe-form ITO circuits (sheet resistance: 15 Ω□) each having a width of 80 μm were formed in parallel and linearly on a glass substrate having a thickness of 1.1 mm, at intervals of 20 μm (100 μm pitch).

(2) Formation of Positive Photoresist Film

A positive photoresist film having a film thickness of 1.5 μm was formed by adding 20 parts by weight of ethyl cellosolve acetate to 100 parts by weight of a positive photoresist composition (tradename: FH2030, manufactured by Fuji Hant Electronics Technology Co.) to obtain a mixture, coating the whole surface of the transparent substrate obtained in (1) with the mixture obtained above by spin coating method in two stages, namely firstly at 200 rpm/5 seconds and secondly at 1,000 rpm/20 seconds, and heat-treating the resulting coat at 90° C. for 30 minutes. This procedure illustrates step (a) of the present invention.

(3) Exposure to Light

On the positive photoresist film, a lattice-wise patterned photomask having light-screening window-shaped parts of one window size of 60 μm×200 μm was aligned with the ground transparent conductive circuits (lines/spaces: 80 μm/20 μm) so as to locate the window-parts on the circuit line. The gap between the photomask and the photoresist film was 30 μm. Then, the resulting product was exposed to light at a light exposure of 100 mJ/cm$^2$ with Proximity Exposing Machine (MAP-1200, manufactured by Dainippon Kaken Co.) using super-high pressure mercury lamp as light source. This procedure illustrates step (b) of the present invention.

(4) Development

After the exposure, the product of (3) was immersed in a developing solution (tradename: SOPD, manufactured by Sumitomo Chemical Co. Ltd.) for 60 seconds at 25° C. to eliminate and develop the exposed parts, and then rinsed with water and air-dried. Thus, a lattice-form, frame-shaped positive photoresist film having window-shaped pits on the ground, parallel stripe-form transparent conductive circuits was formed. This procedure illustrates step (c) of the present invention.

(5) Second Exposure to Light

The substrate obtained in (4) having a lattice-form, frame-shaped positive photoresist film was exposed to light again at a light exposure of 200 mJ/cm$^2$ with Proximity Exposing Machine (MAP-1200, manufactured by Dainippon Kaken Co.) using super-high pressure mercury lamp as light source. This procedure illustrates step (d) of the present invention.

(6) Formation of Electro-deposited Film

Using prescribed transparent conductive circuits on the transparent substrate as one electrode, electro-deposition was carried out in order of red, green and blue coatings. As the electro-deposition coating materials, aqueous solutions of an anionic polyester resin containing a red pigment (azo metallic salt type red pigment), a green pigment (Phthalocyanine Green) and a blue pigment (Phthalocyanine Blue), respectively, in the state of dispersion [tradename Shintron F-Red-C (red), tradename Shintron F-Green-C (green) and tradename Shintron F-Blue-C (blue), all manufactured by Shinto-Chemitron Co.] were used. The electro-deposition was carried out at 50–80 V for a period of 10–20 seconds, which conditions were varied depending on the color. Then, the resulting electro-deposited films were thoroughly washed with water and heat-treated at 120° C. for 10 minutes.

As a result, red-, green- and blue-colored films each having a thickness of 1.2 μm were formed in the prescribed order in the window-shaped pits carrying no positive photoresist film. These films had properties of screening UV light used in (9) described below. This procedure illustrates step (e) of the present invention.

(7) Elimination of Positive Photoresist Film

The transparent substrate obtained by the above-mentioned steps was immersed in 5% by weight caustic soda solution at room temperature for 10 minutes, and then the positive photoresist film on the substrate was brushed while showering deionized water to eliminate and peel off the positive photoresist film only. Then, the resulting product was thoroughly washed, air-dried and heat-treated at 260° C. for one hour. This procedure illustrates step (f) of the present invention.

(8) Formation of Negative Photoresist Film

A coating material for black mask (negative photoresist, manufactured by Shinto-Chemitron Co.) was coated by the screen printing method on the whole surface of the substrate obtained in (7). After the coating, the coating film was heat-treated at 100° C. for 10 minutes. The film thus formed had a thickness of about 8 μm. This procedure illustrates step (g) of the present invention.

(9) Exposure of Negative Photoresist Film to Light

The substrate obtained in (8) was exposed to UV light of 80 W from the opposite side of the conductive circuits-carrying surface at a distance of 10 cm for a period of 10 seconds. The main wavelengths of the UV light used herein were 313 nm and 365 nm. This procedure illustrates step (h) of the present invention.

(10) Development and Washing

The substrate obtained in (9) was then immersed in ethyl cellosolve acetate for 2 minutes, while applying ultrasonic wave thereto, whereby the coating film of the unexposed parts [the parts obstructed from exposure due to the existence of light-screening film formed in (6)] was eliminated. Then, the resulting product was immersed in an ethyl cellosolve acetate washing liquor for 30 seconds, and thereafter immersed in isopropyl alcohol and deionized water successively each for a period of 30 seconds. Then, the resulting product was heated and the remaining films were cured at 230° C. for 30 minutes.

As a result, a lattice-form, frame-shaped functional film (black matrix, film thickness: 1.2 µm) was formed. This procedure illustrates step (i) of the present invention.

FIGS. 2a–2c shows the pattern of the thus obtained window-shaped, color films and the lattice-form, frame-shaped functional film.

Observation of the product obtained herein by means of an optical microscope revealed that no leakage of light was noticeable between the window-shaped, color films and the lattice-form, frame-shaped functional film, and the films were all formed with a high precision.

According to the method of the present invention, there can be formed, on a transparent substrate having a plurality of electrically conductive circuits on a surface thereof, window-shaped, coating films located on the electrically conductive circuits and a frame-shaped, coating film having light-screening properties or other desirable functions at the regions not occupied with the window-shaped coating films with high precision. Particularly, a coating film with fine patterns in which each window-shaped part has a width of less than 100 µm can be formed with high precision. Thus, the method of the present invention is suitable for producing, for example, a color filter for use in LCD well prevented from the leakage of light, excellent in clearance of color parts and quite excellent in optical properties, and particularly suitable for producing the color filters used in matrix type color display using TFT and color filters.

What is claimed is:

1. A method for manufacturing a substrate having electrically conductive circuits on the surface of a transparent substrate, window-shaped colored coating films on the electrically conductive circuits and a frame-shaped, light screening coating film at the regions not occupied with the window-shaped colored coating films, which comprises the steps of:

(a) coating a transparent substrate having electrically conductive circuits on the surface thereof with a negative or positive photoresist composition to cover the whole circuits-carrying surface of the substrate, followed by forming a photoresist film, (b) superposing, on the surface of the photoresist film formed through step (a), a photomask and exposing the photoresist film to light through the photomask, the photomask having a pattern designed so as to give the photoresist film a shape prescribed by the following step (c), (c) subjecting the resulting substrate formed through steps (a) and (b) to development, eliminating the photoresist film in the window-shaped parts on the electrically conductive circuits or both the photoresist film in the window-shaped parts on the electrically conductive circuits and that in the parts adjacent to one or both of the left and right sides of the window-shaped parts and leaving the photoresist film in the other parts, and (d) subjecting the photoresist film left in step (c) to heat-treatment, second exposure to light or no treatment, (e) subjecting the substrate formed through steps (a) to (d) in this order to electro-deposition using the circuits on the substrate as one electrode, forming electro-deposition colored coating films at the window-shaped parts on the circuits, the electro-deposition colored coating films being capable of screening light emitted in the following step (h), (f) eliminating the photoresist film having been subjected to heat-treatment, second exposure to light or no treatment in step (d) and leaving the electro-deposition colored coating films formed in step (e), (g) coating the substrate formed through steps (a) to (f) in this order with a negative photoresist composition capable of giving a light screening coating film to cover the whole circuits-carrying surface of the substrate, followed by forming a light screening coating film, (h) exposing the substrate formed through steps (a) to (g) in this order to light emitted from the opposite side of the circuits-carrying surface of the substrate, and (i) eliminating the uncured light screening coating film having not been exposed to light in step (h), provided that when the photoresist film left in step (c) has a shape of lattice, the treatment of step (d) is heat treatment or second exposure to light.

2. A method according to claim 1, wherein the photomask used in step (b) has a pattern designed so as to give the photoresist film not covering the window-shaped parts on the electrically conductive circuits but covering the frame-shaped part after the development of step (c), and the treatment of step (d) is heat-treatment.

3. A method according to claim 1, wherein the photomask used in step (b) has a pattern designed so as to give the photoresist film not covering the window-shaped parts and the parts adjacent to one or both of the left and right sides of the window-shaped parts but covering the other parts after the development of step (c), and the treatment of step (d) is a heat-treatment.

4. A method according to claim 1, wherein the photomask used in step (b) has a pattern designed so as to give the photoresist film not covering the window-shaped parts and the parts adjacent to one or both of the left and right sides of the window-shaped parts but covering the other parts after the development of step (c), and the treatment of step (d) is no treatment.

5. A method according to claim 1, wherein the photoresist composition of step (a) is a positive photoresist composition and the treatment of step (d) is second exposure to light.

6. A method according to claim 1, wherein the formation of the photoresist film in step (a) is carried out by heat-treatment at 60° to 100° C. for 5 to 60 minutes.

7. A method according to claim 1, wherein the exposure to light in step (b) is carried out at a light exposure of 10 to 500 mJ/cm$^2$.

8. A method according to claim 1, wherein the development in step (c) is carried out using a developing agent selected from (1) aqueous alkaline solution of caustic soda, sodium carbonate, quaternary ammonium salts or organic amines, or (2) organic solvents.

9. A method according to claim 1, wherein the heat-treatment in step (d) is carried out at 150° to 240° C. for 0.5 to 2 hours.

10. A method according to claim 1, wherein the second exposure to light is carried out at a light exposure of 100 to 400 mJ/cm$^2$.

11. A method according to claim 1, wherein the electrodeposition in step (c) is carried out by applying a direct current voltage of 10 to 300 V for about 1 second to about 3 minutes.

12. A method according to claim 1, wherein the elimination of the photoresist film in step (f) is carried out using a dissolving agent selected from (1) aqueous alkaline solution of caustic soda, sodium carbonate, quaternary ammonium salts or organic amines, or (2) organic solvents.

13. A method according to claim 1, wherein the formation of the functional coating film in step (g) is carried out by heat-treatment at 60° to 120° C. for 1 to 30 minutes.

14. A method according to claim 1, wherein the exposure to light in step (h) is carried out using an ultraviolet ray at a light exposure of 100 to 2000 mJ/cm$^2$.

15. A method according to claim 1, wherein the elimination of the uncured functional coating film in step (i) is carried out using a developing agent selected from (1) aqueous alkaline solutions of caustic soda, sodium carbonate, quaternary ammonium salts or organic amines, or (2) organic solvents.

16. A method according to claim 1, wherein the electrodeposition coating film is a colored coating film and the functional coating film has a function as a black matrix of color filter.

17. A method for manufacturing a color filter for use in a liquid crystal display, which comprises the steps of:

forming the window-shaped colored coating film and the frame-shaped light screening coating film on a transparent substrate having electrically conductive circuits thereon by the method of claim 1, forming an overcoat film on both the window-shaped colored coating film and the frame-shaped light screening coating film, and forming a transparent conductive film on the overcoat film.

* * * * *